United States Patent
Sung et al.

(10) Patent No.: US 7,952,275 B2
(45) Date of Patent: May 31, 2011

(54) DISPLAY DEVICE HAVING A DESICCANT MEMBER CONTACTING A COMMON ELECTRODE

(75) Inventors: Un-cheol Sung, Anyang-si (KR); Jin-koo Chung, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 403 days.

(21) Appl. No.: 12/006,432

(22) Filed: Dec. 31, 2007

(65) Prior Publication Data
US 2008/0231175 A1 Sep. 25, 2008

(30) Foreign Application Priority Data
Mar. 21, 2007 (KR) .................. 10-2007-0027490

(51) Int. Cl.
*H01J 63/04* (2006.01)
*H01J 1/62* (2006.01)
(52) U.S. Cl. .................... 313/512; 313/504
(58) Field of Classification Search .......... 313/512, 313/504, 558; 445/25
See application file for complete search history.

(56) References Cited

U.S. PATENT DOCUMENTS

| 6,833,668 B1* | 12/2004 | Yamada et al. | 313/505 |
| 7,190,115 B2* | 3/2007 | Tsuchiya et al. | 313/512 |
| 7,358,665 B2* | 4/2008 | Yu et al. | 313/512 |
| 2002/0024096 A1* | 2/2002 | Yamazaki et al. | 257/359 |
| 2004/0150319 A1* | 8/2004 | Tomimatsu et al. | 313/495 |
| 2005/0161672 A1* | 7/2005 | Yamazaki et al. | 257/59 |
| 2005/0184652 A1* | 8/2005 | Maruyama et al. | 313/504 |
| 2005/0269926 A1* | 12/2005 | Fukuoka et al. | 313/123 |
| 2006/0220549 A1* | 10/2006 | Kim et al. | 313/512 |
| 2007/0172971 A1* | 7/2007 | Boroson | 438/26 |

FOREIGN PATENT DOCUMENTS

| JP | 2006-54147 | 2/2006 |
| KR | 10-2004-0078774 | 9/2004 |
| KR | 10-2006-0057168 | 5/2006 |

OTHER PUBLICATIONS

English Language Abstract, Publication No. JP2006054147, Feb. 23, 2006, 1 p.
Korean Patent Abstracts, Publication No. 1020040078774, Sep. 13, 2004, 1 p.
Korean Patent Abstracts, Publication No. 1020060057168, May 26, 2006, 1 p.

* cited by examiner

*Primary Examiner* — Peter J Macchiarolo
*Assistant Examiner* — Glenn Zimmerman
(74) *Attorney, Agent, or Firm* — Innovation Counsel LLP (57) ABSTRACT

A display device includes a display panel divided into a display area and a non-display area. An encapsulation member covers the display panel, and a sealant is positioned between the display panel and the encapsulation member. A desiccant member is disposed between the display panel and the encapsulation member. The display panel includes an organic layer formed in the display area and a common electrode covering the organic layer, the common electrode extending in the non-display area. The desiccant member is disposed along a periphery of the common electrode in the non-display area.

10 Claims, 4 Drawing Sheets

DISPLAY DEVICE HAVING A DESICCANT MEMBER CONTACTING A COMMON ELECTRODE

CROSS-REFERENCE TO RELATED APPLICATION

This application claims priority from Korean Patent Application No. 10-2007-0027490, filed on Mar. 21, 2007 in the Korean Intellectual Property Office, the disclosure of which is incorporated herein by reference.

BACKGROUND OF THE INVENTION

1. Field of the Invention

Apparatuses and methods consistent with the present invention relate to a display device and a manufacturing method thereof, and more particularly, to a display device that provides enhanced durability, and a manufacturing method thereof.

2. Description of the Related Art

There are various types of display devices.

Among the various types of display devices, a liquid crystal display (LCD) device and an organic light emitting display (OLED) display device are representative display devices since they are light weight and small-sized, and have improved in performance according to rapidly developing semiconductor technology.

The LCD device and the OLED display device generally use a display panel where a thin film transistor (TFT) having a gate electrode, a source electrode, and a drain electrode is formed. Herein, the display panel displays an image through a plurality of pixels. The pixel is a minimum unit of displaying an image.

The OLED display device includes an organic light emitting diode. The organic light emitting diode includes an organic layer, an anode electrode, and a cathode electrode. The organic layer is interposed between the anode electrode and the cathode electrode.

In general, the organic layer is covered by the cathode electrode. However moisture may permeate through the interface of the cathode electrode and contact with the organic layer.

As described, if moisture contacts with the organic layer, the organic layer may shrink. Accordingly, the performance of the organic light emitting diode may deteriorate. Also, the life span of the display device may decrease, and the quality of the display device may deteriorate.

SUMMARY OF THE INVENTION

In accordance with one aspect of the present invention a display device having enhanced durability is provided.

In accordance with another aspect of the present invention, a manufacturing method of a display device having enhanced durability is provided.

In one embodiment of the present invention a display device is provided which comprises: a display panel divided into a display area and a non-display area; an encapsulation member covering the display panel; a sealant sealing between the display panel and the encapsulation member; and a desiccant member disposed between the display panel and the encapsulation member, the display panel including an organic layer formed in the display area and a common electrode covering the organic layer and extending in the non-display area, and the desiccant member disposed along a periphery of the common electrode in the non-display area.

According to another aspect of the invention, the desiccant member overlaps the edge of the common electrode.

The desiccant member has a width of from about 0.5 mm to about 10 mm.

The desiccant member has a thickness of from about 0.1 mm to about 1 mm.

In one embodiment, the desiccant member is made by drying a liquid desiccant coated along the periphery of the common electrode and activating the dried liquid desiccant.

In another aspect of the invention, the liquid desiccant is dried in the temperature ranged from about 40 degrees Celsius to about 90 degrees Celsius.

In a further aspect of the invention, the activating of the dried liquid desiccant is performed using a laser.

According to an aspect of the invention, the display panel further includes a substrate member, a plurality of thin film transistors disposed on the substrate member and a plurality of pixel electrodes connected to a portion of the plurality of thin film transistors, and the organic layer is disposed on the pixel electrode.

In another aspect of the invention, the display device further includes an additional desiccant member which is adhered to the encapsulation member.

In a further aspect of the invention, the additional desiccant is disposed on at least one of the display area and the non-display area.

In accordance with an embodiment of the present invention, a manufacturing method for a display device manufacturing method is provided, the method comprising: preparing a display panel including an organic light emitting diode (OLED) including a organic layer and a common electrode covering the organic layer; applying a liquid desiccant along the periphery of the common electrode; covering the display panel with a encapsulation member; and forming a desiccant member by activating the liquid desiccant.

According to a further aspect of the invention, the desiccant member overlaps the edge of the common electrode.

According to an aspect of the invention, the display device manufacturing method further includes drying the liquid desiccant disposed along a periphery of the common electrode before activating the liquid desiccant.

According to an aspect of the invention, the liquid desiccant is dried in the temperature ranged from 40 degrees Celsius to 90 degrees Celsius.

According to an aspect of the invention, the activation of the liquid desiccant is performed using a laser.

According to an aspect of the invention, the display device manufacturing method further includes attaching an additional desiccant member to the encapsulation member.

BRIEF DESCRIPTION OF THE DRAWINGS

The accompanying drawings, which are included to provide a further understanding of the invention illustrate embodiments of the invention, and together with the description serve to explain the principles of the invention.

DETAILED DESCRIPTION OF EXEMPLARY EMBODIMENTS OF THE INVENTION

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure is thorough, and will fully convey the scope of the invention to those skilled in the art. In the drawings, the size and relative sizes of layers and regions may be exaggerated for clarity. Like reference numerals in the drawings denote like elements.

It will be understood that when an element or layer is referred to as being "on" or "connected to" another element or layer, it can be directly on or directly connected to the other element or layer, or intervening elements or layers may be present. In contrast, when an element is referred to as being "directly on" or "directly connected to" another element or layer, there are no intervening elements or layers present.

The accompanying drawings show an organic light emitting diode display (OLED) device.

In addition, the accompanying drawings also show an active matrix (AM)-type OLED having a 2Tr-1Cap structure and in which one pixel includes two thin film transistors (TFTs) and one capacitor, but it is not limited thereto. Herein, the pixel is a minimum unit displaying an image.

Therefore, in the display device, one pixel may include more that three TFTs and more than two capacitors, and additional wiring may be further provided.

Like reference numerals refer to like elements throughout. The exemplary embodiments are described below so as to explain the present invention by referring to the figures.

Constituent elements having the same structures throughout the embodiments are denoted by the same reference numerals and are described in a first embodiment. In the other embodiments, only the constituent elements other than the same constituent elements are described. Like reference numerals designate like elements throughout the specification.

In the drawings, the thickness of layers, films, panels, regions, etc., are exaggerated for clarity.

Figure 1:
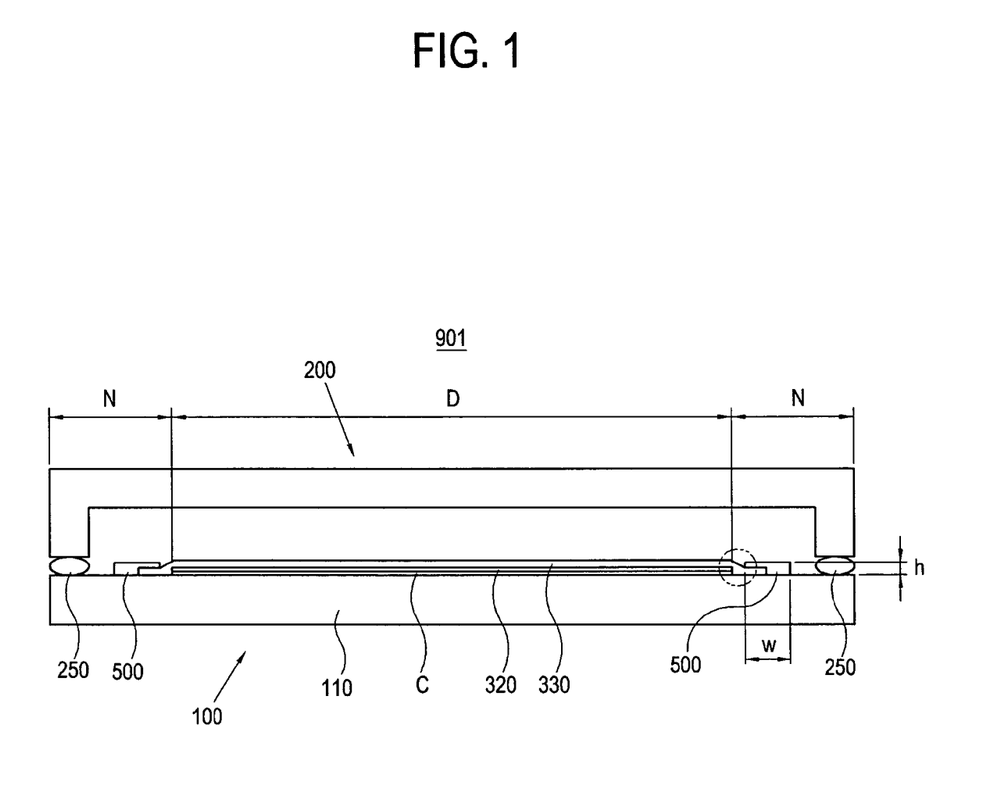
FIG. 1 is a cross-sectional view of a display device according to a first exemplary embodiment of the present invention.
Figure 2:
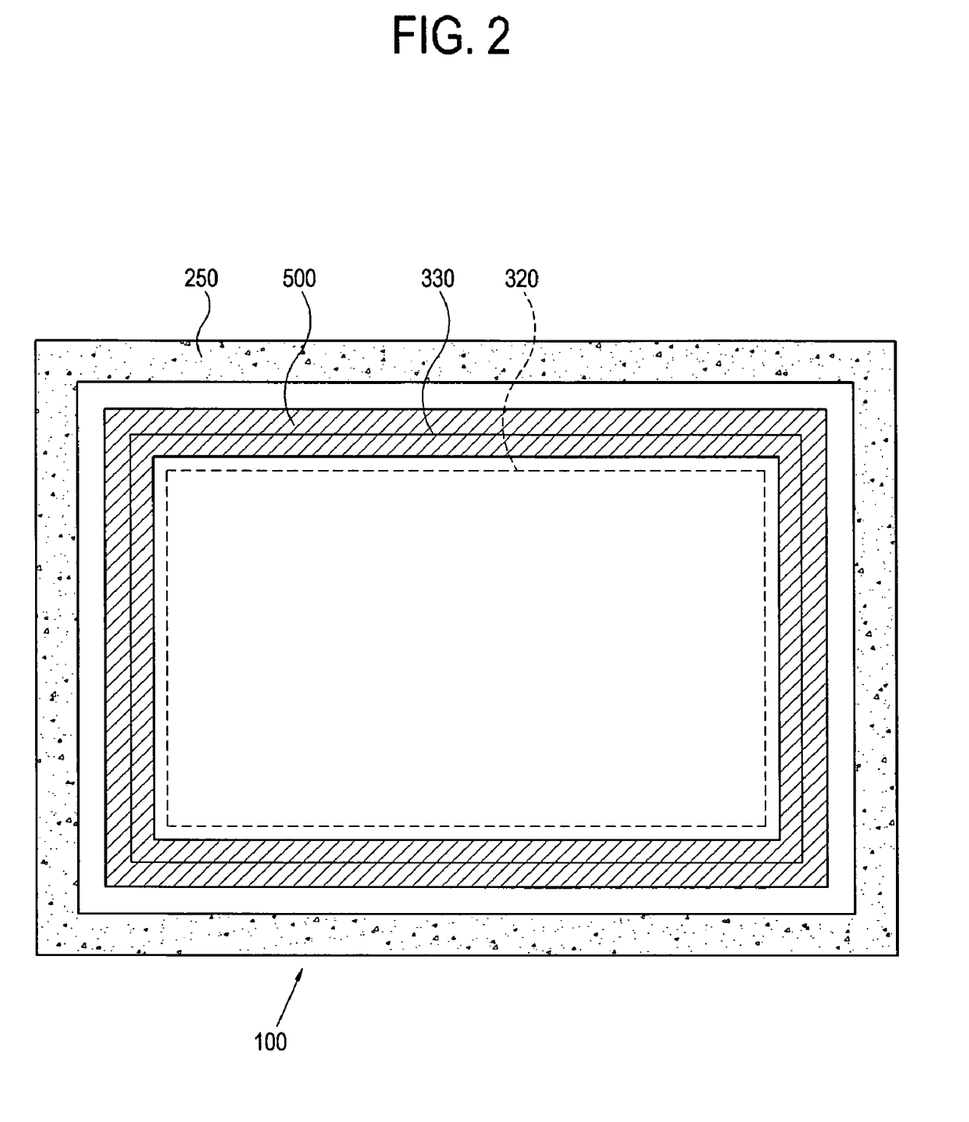
FIG. 2 is a layout view of a display panel in FIG. 1.

FIG. 1 is a cross-sectional view of a display device according to a first exemplary embodiment of the present invention. FIG. 2 is a layout view of the display panel.

As shown in FIG. 1, a display device 901 includes a display panel 100, an encapsulation member 200 covering the display panel 100, a sealant 250 sealing between the display panel 100 and the encapsulation member 200, and a desiccant member 500 disposed on the display panel 100.

The display panel 100 is divided into a display area D and a non-display area N surrounding the display area D. The display panel 100 includes a substrate member 110, a circuit forming layer C formed on the substrate member 110, an organic layer 320, and a common electrode 330.

The circuit forming layer C includes a various electrical conductors such as a gate line, a data line, and a common power line, thin film transistors (10, 20 of FIG. 3) connected to the electrical conductors, and a capacitor. The circuit forming layer C further includes a pixel electrode (310 of FIG. 3) connected to thin film transistors (10, 20 of FIG. 3). The pixel electrode (310 of FIG. 3) is substantially formed in the display area D of the display panel 100. The thin film transistors (10, 20 of FIG. 3) and other constituent elements are formed in the display area D together with the non-display area N.

The organic layer 320 is formed on the pixel electrode 310. Accordingly, the organic layer 320 is substantially formed in the display area D. The common electrode 330 covers the organic layer 320. The common electrode 330 is disposed in the display layer D and a portion of the common electrode 330 extends into the non-display layer N. That is, the common electrode 330 is formed on the display area D and the non-display area N close to the display area D.

Figure 3:
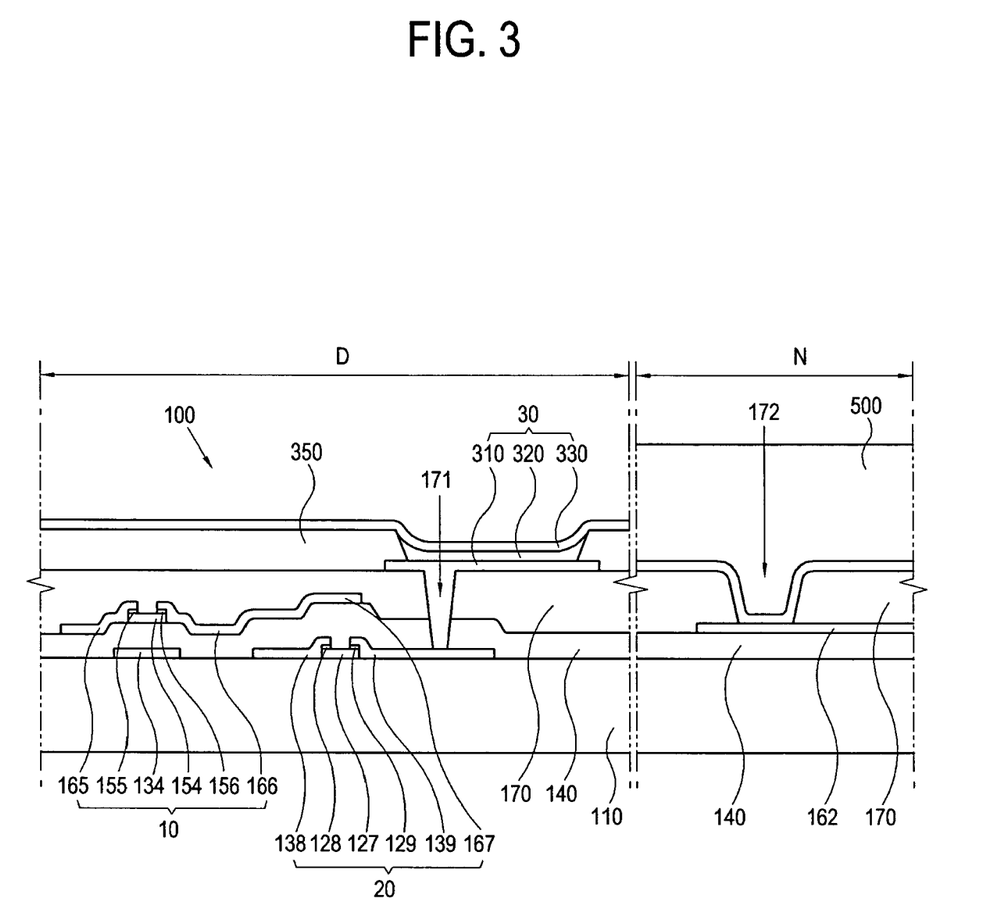
FIG. 3 is an enlarged view of a portion of the display panel in FIG. 1.

The pixel electrode 310, the organic layer 320, and the common electrode 330 form the organic light emitting diode (30 of FIG. 3). That is, the pixel electrode 310 is the cathode electrode of the organic light emitting diode 30, and the common electrode 330 is the anode electrode of the organic light emitting diode 30.

The desiccant member 500 surrounds the periphery of the common electrode 330, and has a width W shown in FIG. 1 of 0.5 mm to 10 mm. As illustrated in FIG. 1 and FIG. 2, desiccant member 500 overlaps the edge of the common electrode 330.

The width of the desiccant member 500 is chosen as a function of the size of the non-display area N. That is, if the width of the desiccant member 500 is excessively large, the size of the non-display area against the display area will become larger. Accordingly, the exterior quality of the display device may deteriorate. On the other hand, if the width of the desiccant member 500 is excessively small, the desiccant member 500 cannot effectively prevent moisture from permeating through the interface of the common electrode 330. Here, the interface of the common electrode 330 refers to an interface between the common electrode 330 and other constituent member therebelow, particularly at the end part of the common electrode 330. The other constituent member may contact the common electrode 330 directly and may comprise a substrate member and/or a thin film other than the substrate member.

The desiccant member 500 surrounding the periphery of the common electrode 330 has a thickness h of from about 0.1 mm to about 1 mm. The desiccant member 500 may be thicker than the common electrode 330. If the thickness h of the desiccant member 500 is smaller than the thickness of the common electrode 330, the desiccant member 500 may crack on the end part of the common electrode 330, through which moisture may permeate. On the other hand, if the thickness h of the desiccant member 500 is larger than the thickness of the common electrode 330, the total size of the display device 901 will be increased.

As shown in FIG. 2, the desiccant member 500 surrounds the periphery of the common electrode 330 in the non-display area N. The desiccant member 500 overlaps the edge of the common electrode 330.

The organic layer 320 doesn't overlap substantially the desiccant member 500, because the organic layer 320 is formed in the display layer D.

The sealant 250 is formed along an outermost part of the display panel 100 and provides a seal between the display panel 100 and the encapsulation member 200.

A manufacturing method of the desiccant member 500 is described below in detail. First, a liquid desiccant is coated along the periphery of the common electrode 330. Herein, the liquid desiccant may be, for example, "DRYLOS" of DuPont Company, U.S. Subsequently, the liquid desiccant is dried in the temperature ranging from about 40 degrees Celsius to 90 degrees Celsius. Then the dried liquid desiccant is activated using a laser. Accordingly, the desiccant member 500 is formed.

With the above-described configuration, the desiccant member 500 prevents moisture passing through the sealant 250 from permeating through the interface of the cathode electrode 330 and contacting the organic layer 320. Particularly, by disposing the desiccant member 500 near the sealant 250 and overlapping the desiccant member 500 along the edge of the common electrode 330, the desiccant member 500 further effectively prevents moisture from permeating through the interface of the cathode electrode 330. This prevents the organic layer 320 from shrinking due to permeation of moisture. Accordingly, deterioration of the quality of the display device 901 may be reduced, and the durability of the display device 901 may be improved.

The structure of the display panel 100 is described below in further detail with reference to FIG. 3.

The display panel 100 displays an image through a plurality of pixels formed in the display area D. The pixel is a minimum unit of displaying an image.

A switching thin film transistor 10, a driving thin film transistor 20, a capacitor (not shown), and organic light emitting diode 30 are formed in one pixel.

Although it is not shown in the drawings, the display panel 100 further includes a gate line extending in one direction, a data line crossing the gate line, and a common power line. The switching thin film transistor 10, the driving thin film transistor 20, and the capacitor (not shown) are electrically connected with the gate line, the data line, and/or the common power line, respectively.

The organic light emitting diode 30 includes the pixel electrode 310, the organic layer 320 formed on the pixel electrode 310, and the common electrode 330 formed on the organic layer 320. The pixel electrode 310 serves as a hole injection electrode (i.e., positive electrode) and the common electrode serves as an electron injection electrode (i.e., negative electrode). Holes and electrons are respectively injected into the organic layer 320 from the pixel electrode 310 and the common electrode 320. The injected holes and electrons form excitons. When the excitons change from the excited state to a base state, light is emitted.

The capacitor (not shown) includes a pair of storage electrodes. An insulating layer 140 is interposed between the pair of storage electrodes.

The switching thin film transistor 10 includes a switching gate electrode 134, a switching source electrode 165, and a switching drain electrode 166. The driving thin film transistor 20 includes a driving gate electrode 167, a driving source electrode 138, and a driving drain electrode 139.

The switching thin film transistor 10 is used as a switching element for selecting a light emitting pixel. The switching gate electrode 134 is branched from the gate line. The switching source electrode 165 is branched from the data line. The switching drain electrode 166 is independently disposed and electrically connected with the driving gate electrode 167.

The switching thin film transistor 10 further includes a switching semiconductor layer 154. A part of the switching semiconductor layer 154 is interposed between the switching gate electrode 134 and the switching source electrode 165 and between the switching gate electrode 134 and the switching drain electrode 166. The switching semiconductor layer 154 overlaps the switching gate electrode 134, and at least portions of the switching source electrode 165 and at least portions of the switching drain electrode 166 overlap the switching semiconductor layer 174, respectively.

In addition, the switching thin film transistor 10 further includes switching ohmic contact layers 155 and 156 respectively interposed between the switching semiconductor layer 154 and the switching source electrode 165 and between the switching semiconductor layer 154 and the switching drain electrode 166. The switching ohmic contact layer 155 contacts the switching semiconductor layer 154 and the switching source electrode 165. The switching ohmic contact layer 156 contacts the switching semiconductor layer 155 and the switching drain electrode 166.

The driving thin film transistor 20 applies a driving power to the pixel electrode 310 for emitting the organic layer 320 of a selected organic light emitting diode 30.

The driving source electrode 138 of the driving thin film transistor 20 is branched from a common power line (not shown). The driving drain electrode 139 is electrically connected to the pixel electrode 310 of the organic light emitting diode 30. The pixel electrode 310 is connected to the driving drain electrode 139 through the contact hole 171.

The driving thin film transistor 20 includes a driving semiconductor layer 127. The driving semiconductor layer 127 is arranged below the driving gate electrode 167, the driving source electrode 138, and the driving drain electrode 139, and overlaps them.

The driving thin film transistor 20 further includes driving ohmic contact layers 128 and 129. The driving ohmic contact layer 128 contacts the driving semiconductor layer 127 and the driving source electrode 138. The driving ohmic contact layer 129 contacts the driving semiconductor layer 127 and the driving drain electrode 139.

Although it is not shown in the drawings, the pair of storage electrodes forming the capacitor is respectively connected with the common power line and the driving gate electrode 167, and overlapped each other.

With the above-described configuration, the switching thin film transistor 10 is driven by gate voltage supplied through the gate line and supplies the gate voltage to the driving thin film transistor 20.

A voltage corresponding to difference between the common voltage supplied from the common power line to the driving thin film transistor 20 and the data voltage supplied from the switching thin film transistor 10 is stored into the capacitor (not shown).

A current corresponding to the voltage stored into the capacitor (not shown) flows into the organic light emitting diode 30 through the driving thin film transistor 20 to emit light.

The display panel 100 may further include various electrical conductors and circuit elements disposed on the non-display area N.

A portion of the electrical conductors is electrically connected with the common electrode 330 extending from the display area D to the non-display area N, and supplies a voltage to the common electrode 330.

The electrical conductors is covered with an insulating layer 140 and/or a passivation layer 170. The passivation layer 170 is formed with an opening region 172 and the common electrode 330 contacts a portion of the electrical conductors 129 through the opening region 172.

The desiccant member 500 is disposed along a periphery of the common electrode 330 in the non-display area, and overlaps the edge of the common electrode 330. The desiccant member 500 prevents moisture from permeating through the interface of the common electrode 330 and contacting with the organic layer 320.

Hereinafter, the display panel 100 will be described as a lamination order. First, the display panel 100 is described with emphasis on the display area D.

The substrate member 110 is formed of an insulating substrate made of glass, quartz, ceramic, or plastic or a metallic substrate made of stainless steel. When the substrate member 110 is made of a material having flexibility, a utilization range of the display device 100 can be increased so that availability of the display device 100 improves.

The driving semiconductor layer 127 is formed on the substrate member 110. The driving semiconductor layer 127 is made of polysilicon.

Although not shown in the drawings, a buffer layer may be interposed between the substrate member 110 and the driving semiconductor layer 127 as necessary. Herein, the buffer layer prevents impurities of the substrate member 110 from penetrating therethrough and provides planar the surface.

The switching gate electrode 134, the driving source electrode 138, and the driving drain electrode 139 are formed on the substrate member 110 and the driving semiconductor layer 127. At least portion of the driving source electrode 138 and at least portion of the driving drain electrode 139 overlap the driving semiconductor layer 127, respectively.

Driving ohmic contact layers 128 and 129 are interposed between the driving semiconductor layer 127 and the driving source electrode 138 and between the driving semiconductor layer 127 and the driving drain electrode 139. The driving ohmic contact layers 128 and 129 are made of n+polysilicon in which an n-type impurity is highly doped. The driving ohmic contact layers 128 and 129 reduce a contact resistance between the driving semiconductor layer 127 and the driving source electrode 138 and between the driving semiconductor layer 127 and the driving drain electrode 139.

An insulating layer 140 is formed on the switching gate electrode 134, the driving source electrode 138, and the driving drain electrode 139. On the insulating layer 140, the switching semiconductor layer 154 is formed. The switching semiconductor layer is made of an amorphous silicon layer.

On the insulating layer 140 and the switching semiconductor layer 154, the switching source electrode 165, the switching drain electrode 166, and the driving gate electrode 167 is formed. Herein, the driving gate electrode 167 is electrically connected to the switching drain electrode 166. At least portion of the switching source electrode 165 and at least portion of the switching drain electrode 166 overlap the switching semiconductor layer 154, respectively.

In addition, switching ohmic contact layers 155 and 156 are interposed between the switching semiconductor layer 154 and the switching source electrode 165 and between the switching semiconductor layer 154 and the switching drain electrode 166. The switching ohmic contact layers 155 and 156 are made of n+amorphous silicon in which an n-type impurity is highly doped. The switching ohmic contact layers 155 and 156 reduce a contact resistance between the switching semiconductor layer 154 and the switching source electrode 165 and between the switching semiconductor layer 154 and the switching drain electrode 166.

A passivation layer 170 is formed on the switching source electrode 165, the switching drain electrode 166, and the driving gate electrode 167. The passivation layer 170 preferably has a characteristic of planarization.

The passivation layer 170 includes a contact hole 171. The contact hole 171 is formed together with the passivation layer 170 and the insulating layer 140, and partially exposes the driving drain electrode 139.

On the passivation layer 170, a pixel electrode 310 is formed. The pixel electrode 310 is electrically connected to the driving drain electrode 139 through the contact hole 171.

The pixel electrode 310 is formed of a transparent conductive layer made of at least one of indium tin oxide (ITO) and indium zinc oxide (IZO).

A pixel definition layer 350 is formed on the pixel electrode 310. The pixel definition layer 350 includes an opening exposing the pixel electrode 310. That is, the pixel definition layer 350 substantially defines each pixel in the display device 100.

In the opening of the pixel definition layer 350, an organic layer 320 is formed on the pixel electrode 310. The common electrode 330 covers the pixel definition layer 350 and the organic layer 320. The pixel electrode 310, the organic layer 320, and the common electrode 330 form the OLED 30.

Since the upper surface of the passivation layer 170 is flat, the pixel electrode 310 and the organic layer 320 formed on the passivation layer 190 are also flat. As described, when the organic layer 320 is formed flat and thus has a uniform thickness, the OLED 30 can have uniform luminance.

The organic layer 320 is made of a low molecular organic material or a polymer material. The organic layer 320 may be formed as multiple layers including a hole-injection layer (HIL), a hole-transporting layer (HTL), an emission layer, an electron-transporting layer (ETL), and an electron-injection layer (EIL). That is, the HIL is disposed on the pixel electrode 310 which is a positive electrode, and the HTL, the emission layer, the ETL, and the EIL are sequentially stacked on the HIL. The foregoing described structures as well as those described below are well known in the art and accordingly description thereof is not required.

The HIL and the HTL may be provided as an amine derivative with strong fluorescence, for example, a triphenyl-diamine derivative, a styryl amine derivative, and an aromatic condensed ring.

The ETL may be provided as a quinoline derivative, particularly, aluminum tris (8-hydroxyquinoline) (Alq3). In addition, the ETL may also be provided as a phenyl anthracene derivative or a tetrarylethene derivative.

The EIL may be provided as barium (Ba) or calcium (Ca).

The emission layer emits at least one of white, red, blue, and green. The adjacent emission layers may emit different colors.

In other embodiments, a color filter may be interposed between the organic layer 320 and the substrate member 110. In this case, the emission layer emits white light.

When the organic layer 320 is made of polymer material, the organic layer 320 can be formed using an ink jetting method. In this case, the HIL can be made of a hole injection material such as poly (3,4-ethylene dioxythipoene) (PEDOT) or polystyrene sulfonate (PSS). The emission layer may be made of a polyfluorene derivative, a (poly)paraphenylenevi-nylene derivative, a polyphenylene derivative, a polyvinylcarbazole derivative, a polythiophene derivative or one of above mentioned polymer doped with a perylene pigment, a rodermine pigment, rubrene, perylene, 9,10-diphenylanthracene, tetraphenylbutadiene, Nile red, coumarin 6, or quinacridone.

In the first exemplary embodiment, the pixel electrode 310 is the positive electrode and the common electrode 330 is the negative electrode, but they are not limited thereto.

That is, the pixel electrode 310 may be the negative electrode (i.e., EIL) and the common electrode 330 may be the positive electrode (i.e., HIL). In this case, the organic layer 320 is formed by sequentially stacking the EIL, the ETL, the emission layer, the HTL, and the HIL on the pixel electrode 310.

In the first exemplary embodiment of the present invention, the switching thin film transistor 10 is an amorphous silicon thin film transistor comprising the switching semiconductor layer 174 made of amorphous silicon. In addition, the driving thin film transistor 20 is a polysilicon thin film transistor comprising the semiconductor layer 127 made of polysilicon.

The amorphous silicon thin film transistor has a small leakage current, but its performance becomes unstable when it is used for a long period of time. On the other hand, the performance of the polysilicon thin film transistor is stable, but it has a relatively large leakage current.

When the polysilicon thin film transistor is used as the driving thin film transistor 20, the amount of leakage current in the turn-off state does not cause the OLED to be turned on, and therefore, the leakage current does not cause a problem. However, when the polysilicon thin film transistor is used as the switching thin film transistor 10, a defect such as a cross talk occurs due to the leakage current.

Therefore, the driving thin film transistor is provided as polysilicon thin film transistor in order to maintain the display device stable in quality, and the switching thin film transistor 20 is provided as amorphous silicon thin film transistor to prevent the defect such as the cross talk.

The display panel 100 is described below with emphasis on the non-display area N. A thin wire 162 is formed on the substrate member 110 in the non-display area N. The thin wire 162 is the same layer as the driving gate electrode 167, the switching source electrode 165 and the switching drain electrode 166. In other embodiment, the thin wire 162 may be the same layer as the switching gate electrode 134, the driving source electrode 138 and the driving drain electrode 139. The thin wire 162 is covered with the passivation layer 170. The passivation layer 170 is formed with the opening region 172 exposing a portion of the thin wire 162.

The common electrode 330 contacts the thin wire 162 through the opening region 172, and receives the common voltage through the thin wire 162.

With the above-described configuration, the durability of the display device 901 may be improved.

A manufacturing method of the display device 901 will be described in detail.

As described above, the display panel 100 including the organic light emitting diode 30 having the organic layer 320 and the common electrode 330 covering the organic layer 320 is prepared.

Then, a liquid desiccant is coated along the periphery of the common electrode 330 to provide desiccant member 550. A suitable material for the liquid desiccant is available from DuPont Company, U.S.A, under the brandname "DRYLOS". The liquid desiccant may be coated using a dispensing method or a screen printing method. The liquid desiccant is dried in the temperature ranged from 40 degrees Celsius to 90 degrees Celsius.

In other embodiments, the drying of the liquid desiccant may be performed in another step or may be omitted.

Next, the display panel 100 is covered with the encapsulation member 200. The sealant 250 seals between the display panel 100 and the encapsulation member 200.

Then, the dried liquid desiccant is activated to form the desiccant member 500. The dried liquid desiccant may be activated using a laser.

The desiccant member 500 formed as described above overlaps the edge of the common electrode 330.

With the above-described manufacturing method, the display device 901 having improved durability can be provided.

Figure 4:
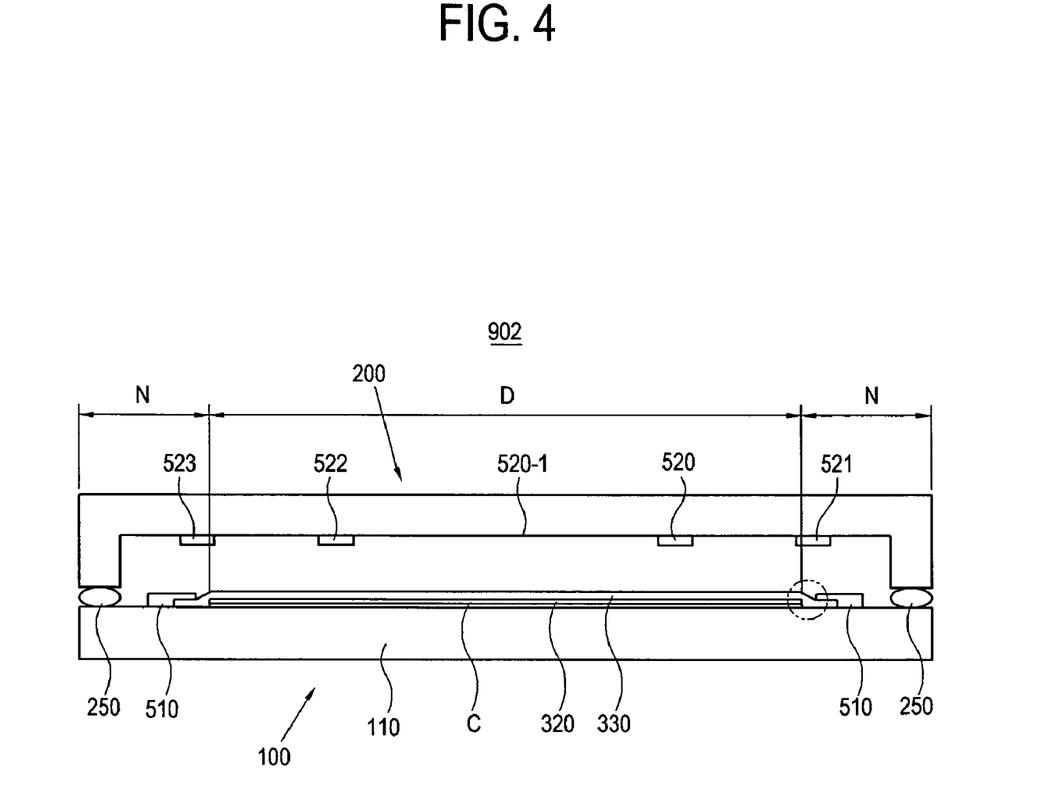
FIG. 4 is a cross-sectional view of a display device according to a second exemplary embodiment of the present invention.

FIG. 4 illustrates a second exemplary embodiment of the present invention.

As shown in FIG. 4, the display device 902 includes a first desiccant member 510 and a second desiccant member 520.

The first desiccant member 510 is disposed on the display panel 100 in the non-display area, surrounding the periphery of the common electrode 330, and overlaping the edge of the common electrode 330.

Desiccant members 520, 521, 522 and 523 are adhered to a surface 520-1 of the encapsulation member 200 facing the display panel 100. Desiccant members 520 and 522 are disposed in the display area D and desiccant members 521 and 523 are disposes in the non-display area N. Desiccant members 520 and 522 which are disposed in the display area D are transparent.

The first desiccant member 510 is formed by activating a liquid desiccant. The liquid desiccant may be coated along the periphery of the common electrode 330, dried and activated to form the first desiccant member 510. However, desiccant members 520-523 may be made of various materials such as [INSERT COMPANY NAME OF SOURCES AND TRADEMARKS.].

With the above-described configuration, moisture permeation is more effectively prevented by using the desiccant members 510 and 520-523. That is, it can be prevented that the organic layer 320 is shrunk and changed by the permeated moisture. Accordingly, quality deterioration of the display device 901 may be reduced, and the durability of the display device 901 may be increased.

The display device 902 manufacturing method according to the second exemplary embodiment of the present invention includes attaching an additional desiccant members, i.e. desiccant members 520-523 to the encapsulation member 200.

Desiccant members 520-523 are adhered to the encapsulation member 200 to face the display panel 100 before the display panel 100 is covered with the encapsulation member 200.

With the above-described manufacturing method, the durability of the display device 902 is more improved by using in addition to the first desiccant member 510, supplemental desiccant members 520-523.

As described above, according to the exemplary embodiments of the present invention, the durability of the display device may be improved. That is, it is prevented by the desiccant member that moisture permeates through the interface of the cathode electrode and contacts with the organic layer. Accordingly, the performance of the organic light emitting diode can be efficiently prevented from being deteriorated.

In addition, the above-described manufacturing method of the display device can be provided.

Although a few exemplary embodiments of the present invention have been shown and described, it will be appreciated by those skilled in the art that changes may be made in these exemplary embodiments without departing from the principles and spirit of the invention, the scope of which is defined in the appended claims and their equivalents.

What is claimed is:

1. A display device comprising:
    a display panel divided into a display area and a non-display area;
    an encapsulation member covering the display panel;
    a sealant positioned between the display panel and the encapsulation member; and
    a desiccant member disposed between the display panel and the encapsulation member,
    the display panel comprising an organic layer formed in the display area and a common electrode covering the organic layer, a portion of the common electrode extending in the non-display area, and
    wherein the desiccant member contacts an upper surface and a side surface of an edge of the common electrode in the non-display area without covering the display area.

2. The display device of claim 1, wherein the desiccant member has a width in the range of from about 0.5 mm to about 10 mm.

3. The display device of claim 1, wherein the desiccant member has a thickness in the range of from about 0.1 mm to about 1 mm.

4. The display device of claim 1, wherein the desiccant member is made by drying a liquid desiccant coated along the periphery of the common electrode and activating the dried desiccant.

5. The display device of claim 4, wherein the liquid desiccant is dried within a temperature range of from about 40 degrees Celsius to about 90 degrees Celsius.

6. The display device of claim 4, wherein the activating of the dried desiccant comprises directing a laser beam on the dried desiccant.

7. The display device of claim 1, wherein the display panel further comprising a substrate member, a plurality of thin film transistors disposed on the substrate member and a plurality of pixel electrodes connected to a portion of the plurality of thin film transistors, and further wherein the organic layer is disposed on the pixel electrodes.

8. The display device of claim 1, further comprising at least one other desiccant member supported by the encapsulation member.

9. The display device of claim 8, wherein the at least one other desiccant member is supported on at least one of the display area and the non-display area.

10. The display device of claim 1, wherein the desiccant member is thicker than the common electrode.

* * * * *